(12) United States Patent
Cheng et al.

US010132902B2

(10) Patent No.: US 10,132,902 B2
(45) Date of Patent: Nov. 20, 2018

(54) INTRINSIC NAVIGATION FROM VELOCITY-ENCODING GRADIENTS IN PHASE-CONTRAST MRI

(71) Applicant: The Board of Trustees of the Leland Stanford Junior University, Palo Alto, CA (US)

(72) Inventors: Joseph Y. Cheng, Stanford, CA (US); John M. Pauly, Stanford, CA (US); Marcus T. Alley, Palo Alto, CA (US); Shreyas S. Vasanawala, Stanford, CA (US); Michael Lustig, Berkeley, CA (US)

(73) Assignees: The Board of Trustees of the Leland Stanford Junior University, Palo Alto, CA (US); The Regents of the University of California, Oakland, CA (US)

( * ) Notice: Subject to any disclaimer, the term of this patent is extended or adjusted under 35 U.S.C. 154(b) by 656 days.

(21) Appl. No.: 14/721,876

(22) Filed: May 26, 2015

(65) Prior Publication Data

US 2016/0349346 A1    Dec. 1, 2016

(51) Int. Cl.
*G01R 33/565* (2006.01)
*G01R 33/563* (2006.01)
*G01R 33/48* (2006.01)
*G01R 33/567* (2006.01)

(52) U.S. Cl.
CPC . *G01R 33/56509* (2013.01); *G01R 33/56316* (2013.01); *G01R 33/4822* (2013.01); *G01R 33/5676* (2013.01)

(58) Field of Classification Search
CPC ........ G01R 33/56509; G01R 33/56316; G01R 33/5676; G01R 33/4822
USPC .................................. 324/301, 309; 600/410
See application file for complete search history.

(56) References Cited

U.S. PATENT DOCUMENTS

| | | | |
|---|---|---|---|
| 5,399,970 A | 3/1995 | Pelc et al. | |
| 6,292,684 B1 * | 9/2001 | Du | G01R 33/5676 324/309 |
| 6,842,000 B2 * | 1/2005 | Norris | G01R 33/56509 324/309 |
| 7,692,423 B2 | 4/2010 | Cunningham et al. | |
| 8,811,694 B2 | 8/2014 | Mendes et al. | |

(Continued)

OTHER PUBLICATIONS

Joseph Y Cheng, Marcus T Alley, Tao Zhang, Peng Lai, Jonathan I Tamir, Martin Uecker, John M Pauly, Michael Lustig, and Shreyas S Vasanawala. "Soft-gated accelerated Cartesian 4D flow imaging with intrinsic navigation." Annual Meeting ISMRM, Toronto 2015, in Proc. Intl. Soc. Mag. Reson. Med 23; 451 (2015).

*Primary Examiner* — Farhana Hoque
(74) *Attorney, Agent, or Firm* — Beyer Law Group LLP

(57) ABSTRACT

A method for an object in a magnetic resonance image (MRI) system for providing at least one velocity indicative magnetic resonance image (MRI) with motion correction of the object is provided. Velocity encoding gradients in at least one spatial direction are provided from the MRI system. Spatial frequency data resulting from the encoding gradients are acquired through the MRI system. Image signals are provided by the MRI system. Image data resulting from the image signals are acquired through the MRI system. At least one motion corrected and velocity indicative magnetic resonance image is created from the acquired spatial frequency data and image data.

18 Claims, 9 Drawing Sheets

(56) References Cited

U.S. PATENT DOCUMENTS

2003/0011369 A1* 1/2003 Brittain .................. G01R 33/28
                                                      324/309
2014/0210469 A1 7/2014 Cheng et al.

* cited by examiner

INTRINSIC NAVIGATION FROM VELOCITY-ENCODING GRADIENTS IN PHASE-CONTRAST MRI

GOVERNMENT RIGHTS

This invention was made with Government support under contracts EB009690 and EB015891 awarded by the National Institutes of Health. The Government has certain rights in the invention.

BACKGROUND OF THE INVENTION

This invention relates generally to magnetic resonance imaging (MRI).

Magnetic resonance imaging (MRI) is a non-destructive method for the analysis of materials, and provides medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During an MRI process, each nuclear spin responds to four different effects: precession about the main magnetic field, nutation about an axis perpendicular to the main field, and both transverse and longitudinal relaxation. In steady-state MRI processes, a combination of these effects occurs periodically.

Compared with other modalities, such as X-ray, CT and ultrasound, MRI takes longer time, sometimes several minutes, for data acquisition to generate clinically useful images. Undesirable imaging artifacts may appear due to the long scan time. MRI using multiple receiving coils (phased array) has been introduced to shorten the scan time and increase signal to noise ratio (SNR). This fast imaging technique, known as parallel imaging (PI), can significantly accelerate data acquisition, and therefore reduce imaging artifacts and improve image quality.

Motion is a major source of artifacts for Magnetic Resonance (MR) studies. A typical sequence prescribed on the scanner takes anywhere from a couple seconds to a number of minutes. As a result, the scan is sensitive to motion. Motion can come from any number of sources including respiration, cardiac motion, blood flow, and even unintentional patient movement. The effects have been long studied and have been typically observed as ghosting, intensity changes, and blurring.

SUMMARY OF THE INVENTION

In accordance with the invention, a method for an object in a magnetic resonance image (MRI) system for providing at least one velocity indicative magnetic resonance image (MRI) with motion correction of the object is provided. Velocity encoding gradients in at least one spatial direction are provided from the MRI system. Spatial frequency data resulting from the encoding gradients is acquired through the MRI system. Image signals are provided by the MRI system. Image data resulting from the image signals is acquired through the MRI system. At least one motion corrected and velocity indicative magnetic resonance image is created from the acquired spatial frequency data and image data.

In another manifestation of the invention, a method for an object in a multiple channel magnetic resonance image (MRI) system for providing a plurality of velocity indicative magnetic resonance images (MRI) with motion correction of the object is provided. A cycle is provided, wherein each cycle comprises providing from the MRI system velocity encoding gradients in at least one spatial direction, acquiring through the MRI system spatial frequency data resulting from the encoding gradients, providing from the MRI system image signals, and acquiring through the MRI system image data resulting from the image signals, wherein the acquiring the spatial frequency data is at a lower resolution than the acquiring image data. At least one motion corrected and velocity indicative magnetic resonance image is created from the acquired spatial frequency data and image data.

In another manifestation of the invention, an apparatus for providing velocity indicative and motion corrected magnetic resonance images (MRI) is provided. A magnetic resonance imaging excitation and detection system with a plurality of channels is provided. A controller is electrically connected to the magnetic resonance imaging excitation and detection system. The controller comprises a display, at least one processor, and computer readable media. The computer readable media comprises computer readable code for providing velocity encoding gradients in at least one spatial direction from the magnetic resonance imaging excitation and detection system, computer readable code for acquiring, through the plurality of channels, spatial frequency data resulting from the encoding gradients, computer readable code for providing image signals from the magnetic resonance imaging excitation and detection system, computer readable code for acquiring image data resulting from the image signals, through the plurality of channels, computer readable code for creating at least one motion corrected and velocity indicative magnetic resonance image from the acquired spatial frequency data and image data, and computer readable code for displaying the at least one corrected and velocity indicative magnetic resonance image on the display.

The invention and objects and features thereof will be more readily apparent from the following detailed description and appended claims when taken with the drawings.

DETAILED DESCRIPTION OF ILLUSTRATED EMBODIMENTS

Figure 1:
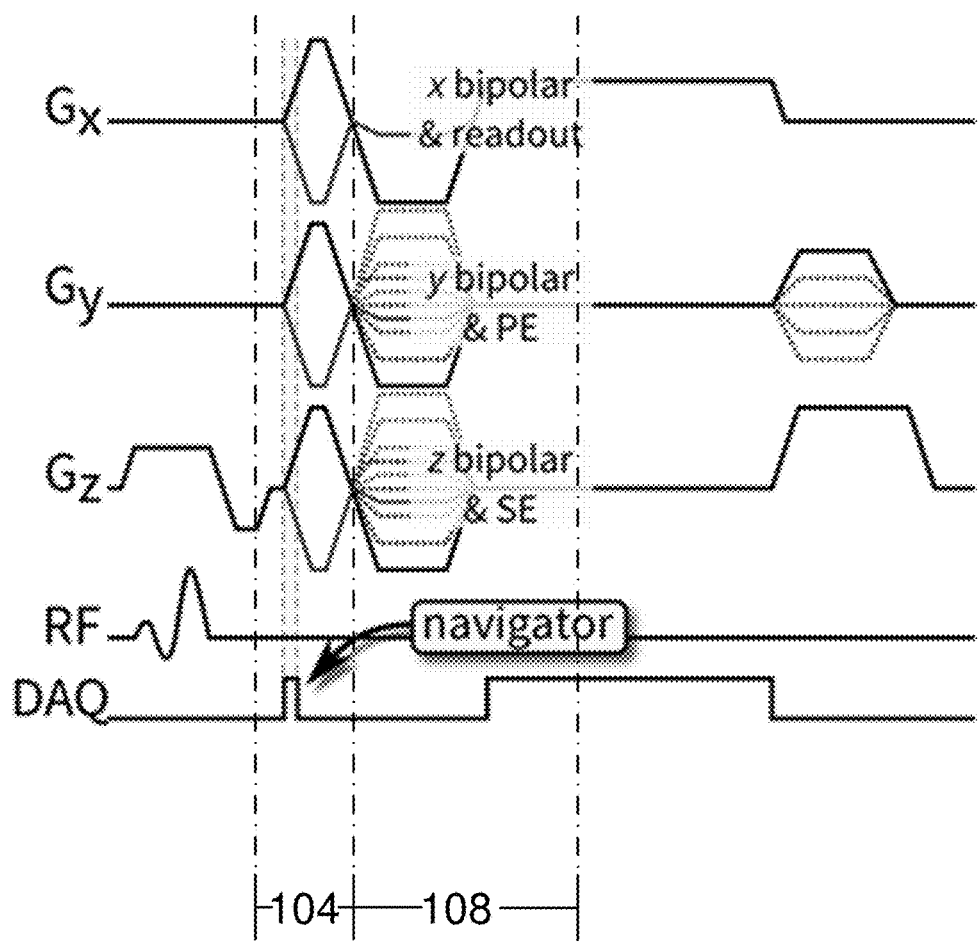
FIG. 1 shows a pulse sequence diagram of a 4D flow technique used in an embodiment of the invention.

Time-resolved phase contrast MRI (4D flow) can quantify cardiac function and flow. Modern acceleration methods enable clinically practical scan times of 3-10 min. Furthermore, 4D flow may even permit complex anatomical assessment, thus comprising a comprehensive exam in a single scan. This ability and the ease of prescribing the scan make the technique provided by various embodiments compelling for the evaluation of congenital heart disease Given a relatively long scan time, the scan needs to be performed with the patient freely-breathing. Thus, motion compensation is required. Additionally, motion should be considered for the 2D variant of the method, especially for patients who cannot hold still or are unable to perform breath-holds. As a first step to motion correction, accurate motion information must be readily available.

Therefore, an embodiment of the invention is able to measure motion intrinsically with very minimal modification to the data acquisition sequence. With this technique, this embodiment is able to acquire MR navigator information every repetition time (TR). This provides high-temporal motion estimation that is nicely aligned with the acquired imaging data.

An application of Cartesian imaging in an embodiment of the invention implements a technique based on the so-called "Butterfly" sequence. Butterfly is a modification of the spin-warp sequence in which the pre-winder gradients for phase-encodes are modified slightly to traverse the same trajectory at the beginning of each data acquisition. This makes it possible to obtain translational motion estimates with high temporal-resolution. The advantage of Butterfly is that it has negligible overhead for the imaging sequence and is particularly attractive for fast gradient-echo sequences. Navigator data can be improved using redundant data from a multi-channel coil array to help extract more accurate information. Such a Butterfly sequenced is described in U.S. Pat. No. 7,692,423, entitled SELF NAVIGATING CARTESIAN TRAJECTORY, to Cunningham et al., and issued on Apr. 6, 2010, which is incorporated by reference for all purposes.

Technical Description

The first moment of the MR imaging gradients encodes velocity information as additive phase in the image. An entire image is acquired with one velocity-encoding gradient. For phase-contrast MRI, two different velocity-encoding gradient configurations are used to encode the acquired images each with a different first moment. Velocities can then be extracted from the phase difference of these two images. Multiple velocity-encoding gradient configurations are used to determine velocity information in different directions. Because these velocity-encodings are commonly used for flow analysis, these can also be referred to as flow-encodings.

The properties of the velocity-encoding gradients allow for the acquisition of MR navigators. Simple 1D projections can be measured directly from the velocity-encoding gradients. This is achieved by simply extending the data readout window to include these velocity-encoding gradients. Since these velocity-encoding gradients are repeated throughout the scan, these gradients provide sufficient data to monitor motion intrinsically without any alteration to the gradient waveforms.

FIG. 1 shows a pulse sequence diagram of a 4D flow technique used in an embodiment of the invention. A typical 3D Cartesian RF-spoiled gradient recalled sequence is depicted with velocity-encoding gradients on each of the axis. The velocity-encoding gradients consist of bipolar gradients whose first moment is used to encode velocity information. For minimum echo time, these velocity-encoding gradients are combined with the pre-winding imaging gradients. Navigators are readily available by extending the readout window to include these velocity-encoding gradients.

Figure 2:
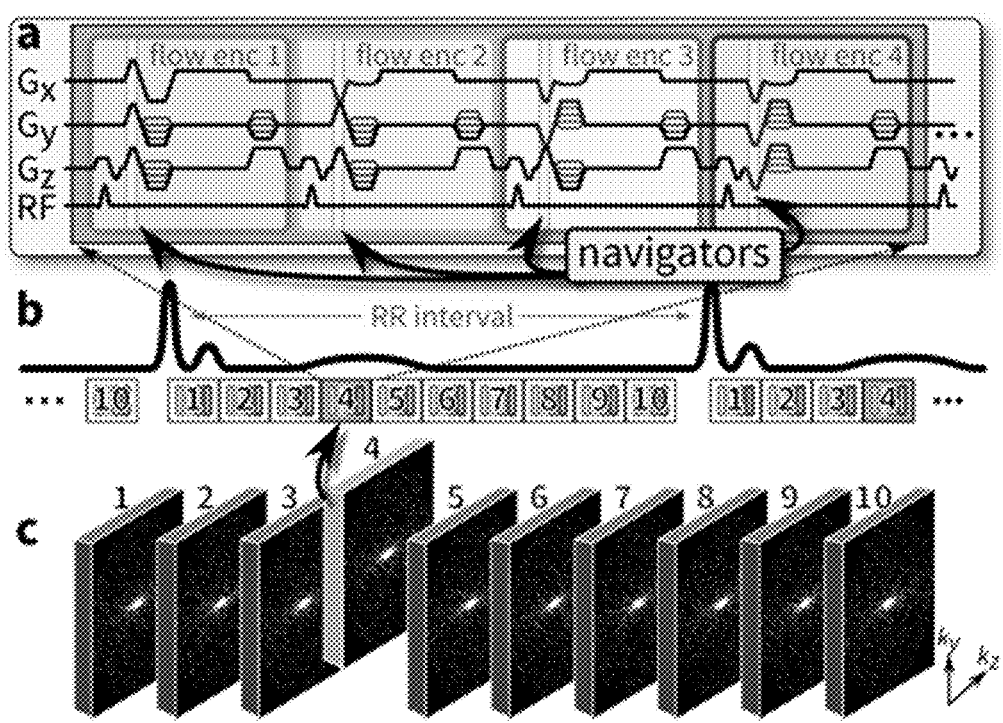
FIG. 2 shows an overview of the 4D flow technique applied to cardiac imaging.

Furthermore, with different velocity-encoding gradient configurations needed for three-direction velocity information, different navigators are acquired. FIG. 2 shows an overview of the 4D flow technique applied to cardiac imaging. FIG. 2a shows one flow-encoding unit consisting of 4 different velocity-encoding configurations with built-in flow navigators acquired during the velocity-encoding gradients. FIG. 2b shows 10 cardiac phases resolved with a velocity-encoding unit per phase—for longer cardiac cycles (RR intervals), patterns are repeated before the next RR interval. FIG. 2c shows sampling and view-ordering that is synchronized to the cardiac triggering. These navigators correspond to 1D-projections along different axes. The motion estimated from these navigators can then be rotated to a logical coordinate system for motion correction purposes. In this embodiment, the different velocity-encoding gradient configurations must be interleaved throughout the scan. For instance, given 4 different configurations (f1, f2, f3, f4), a possible sequence is as follows:

$$(f1,f2,f3,f4),\ (f1,f2,f3,f4),\ (f1,f2,f3,f4),\ (f1,f2,f3,f4),$$
$$\text{and repeat.} \quad (1)$$

For readability, the sequence is divided into groups of 4. Another possibility is to mix up the ordering, but still minimize the time between the same velocity-encoding gradient configurations:

$$(f1,f2,f3,f4),\ (f2,f3,f4,f1),\ (f3,f4,f1,f2),\ (f4,f1,f2,f3),$$
$$\text{and repeat.} \quad (2)$$

The maximum interval between one particular velocity-encoding is 7; this is short enough in most situations to have a sufficient temporal resolution for motion estimation. This later approach allows for more flexibility in designed the sequence.

Figure 3:
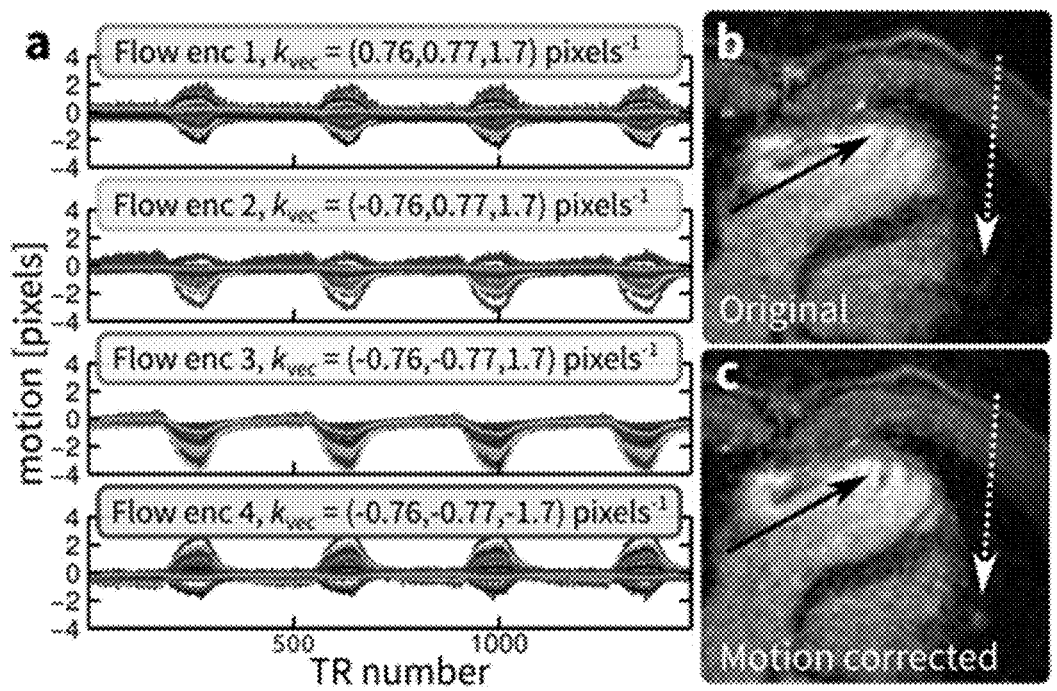
FIG. 3 shows a motion estimated with Butterfly flow navigators.

FIG. 3 shows a motion estimated with Butterfly flow navigators. FIG. 3a shows a motion estimated (cardiac motion suppressed with a stop-band filter) from different velocity-encoding configurations—each shade is from a different channel in a 32-channel coil receiver. FIG. 3b shows a 4D flow scan (9.1 min, reduction factor of 23) of a 22.1-yr-old male. FIG. 3c shows a corrected image using a linear motion estimate selected from FIG. 3a. The nonrigid respiratory motion can be appreciated through the varying degree of motion from different receiver channels (each localized to different spatial locations). In FIG. 3c, the right ventricular trabeculae are sharpened (black arrow); fine vessels are recovered (dotted white).

The localized sensitivities of each element in a multi-channel coil receiver can be exploited to localize the motion estimates and to allow for the description of nonrigid motion. Example motion estimates from a 32-channel cardiac coil is shown in FIG. 3a. The motion estimates for each velocity-encoding gradient is shown on different plots with the axis of the navigators denoted above each graph. The different shades correspond to motion estimates acquired from different channels. Because the main interest for this scan is to resolve cardiac motion, the cardiac motion is suppressed in the motion estimates with a stop-band filter tuned to the cardiac frequency. From the figure, respiratory motion is accurately depicted. This accuracy is demonstrated by using a motion estimate from a single channel to correct the cardiac image of a 22.1-year-old male (FIG. 3c).

This embodiment also demonstrated the use of the motion information in advanced reconstruction methods. The motion estimates can be incorporated as soft-gating weights in a parallel imaging and compressed sensing framework:

$$m = \arg\min_m \tfrac{1}{2}\|W(Am-y)\|_2^2 + \lambda\|R(m)\|_1 \qquad (3)$$

where m are the reconstructed images, W soft-gates the data based on the degree of motion as provided by the navigators, A is a linear model that includes parallel imaging information (such as ESPIRiT), and y is the acquired k-space data. For compressed sensing, the regularization term R(m) and regularization parameter λ are used to exploit sparsity in a sparsifying domain. For the application of 4D flow for cardiac imaging, spatial wavelet operator in the spatial dimensions and finite difference operator in the temporal cardiac cycle dimension are used. This type of reconstruction is demonstrated in FIG. 4.

Figure 4:
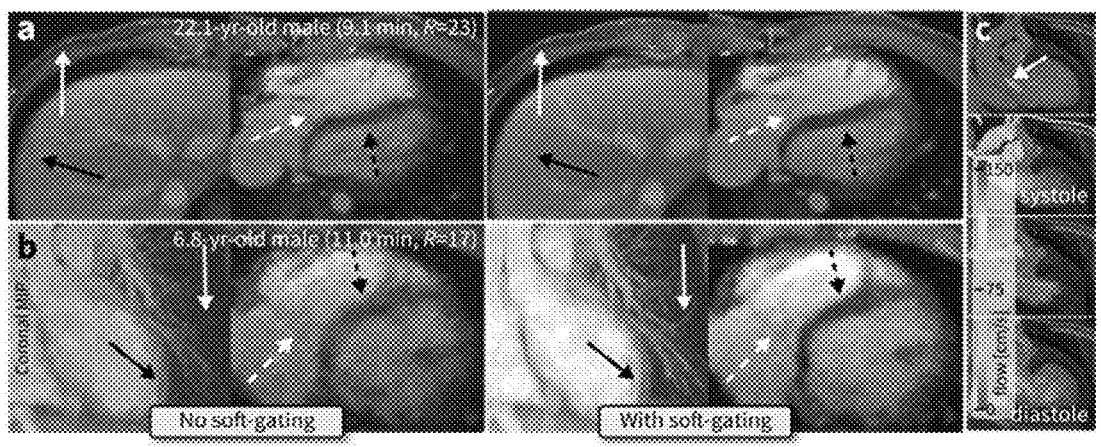
FIG. 4 shows the results for soft-gated 4D flow imaging.

FIG. 4 shows the results for soft-gated 4D flow imaging. FIG. 4a shows axial slices depicting sharpened chest wall (white arrow) and hepatic vessels (black arrow), recovered tricupsid valve septal leaflet (dashed white), and sharpened septum (dashed black). FIG. 4b shows coronal maximum-intensity-projection (left) and axial slice (right) demonstrating recovered bronchial vessels (white arrow), sharpened cardiac wall (black arrow), recovered ventricular valve (dashed white), and enhanced septum (dashed black). FIG. 4c shows velocity rendering for the soft-gated recon of a 14.4-yr-old female (79 BPM, 11.7 min, reduction factor R=11) highlighting aortic regurgitation (arrow). In FIG. 4, soft-gating reduced residual motion artifacts, sharpened the blood and myocardial boundaries, recovered minute hepatic vessels and bronchial vessels.

Figure 5:
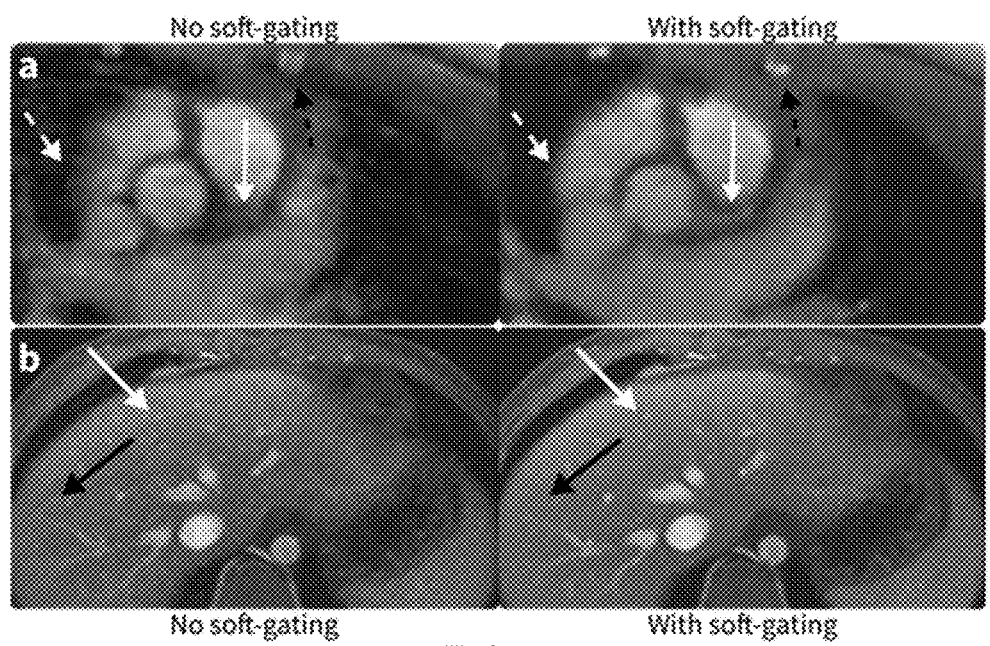
FIG. 5 shows more results for soft-gated 4D flow imaging.

FIG. 5 shows more results for soft-gated 4D flow imaging. FIG. 5a shows an 8-year-old male (74 BPM, 10.9 min, R=15) with sharpened left coronary artery (dashed black) and cardiac wall (dashed white). FIG. 5b shows a 3.8-year-old male (83 BPM, 10.1 min, R=17.1) with recovered fine hepatic vessels (arrows) and reduction of motion ghosting. In FIG. 5a, improved depiction of the left coronary artery can be appreciated with soft-gating from a 4D flow scan of an 8-year-old male. In FIG. 5b, recovery of fine hepatic vessels and reduction of motion ghosting can be seen after soft-gating.

For all scans, Institutional Review Board approval and informed consent was acquired. Subjects were scanned on a 3T GE MR750 scanner using a 32-channel cardiac coil and ferumoxytol enhancement. Scan parameters include echo time of 1.8 ms, repetition time of 9.1 ms with fat saturation pulse, flip angle of 15, resolution of 0.8×0.8×1.4 mm, FOV of 26×18×17 cm, bandwidth of ±83.33 kHz, and scan time of 9-11 min. A variable-density sampling and radial view-ordering scheme was used in the 3D Cartesian sequence to help minimize the severity of the motion artifacts.

Other Embodiments

Figure 6:
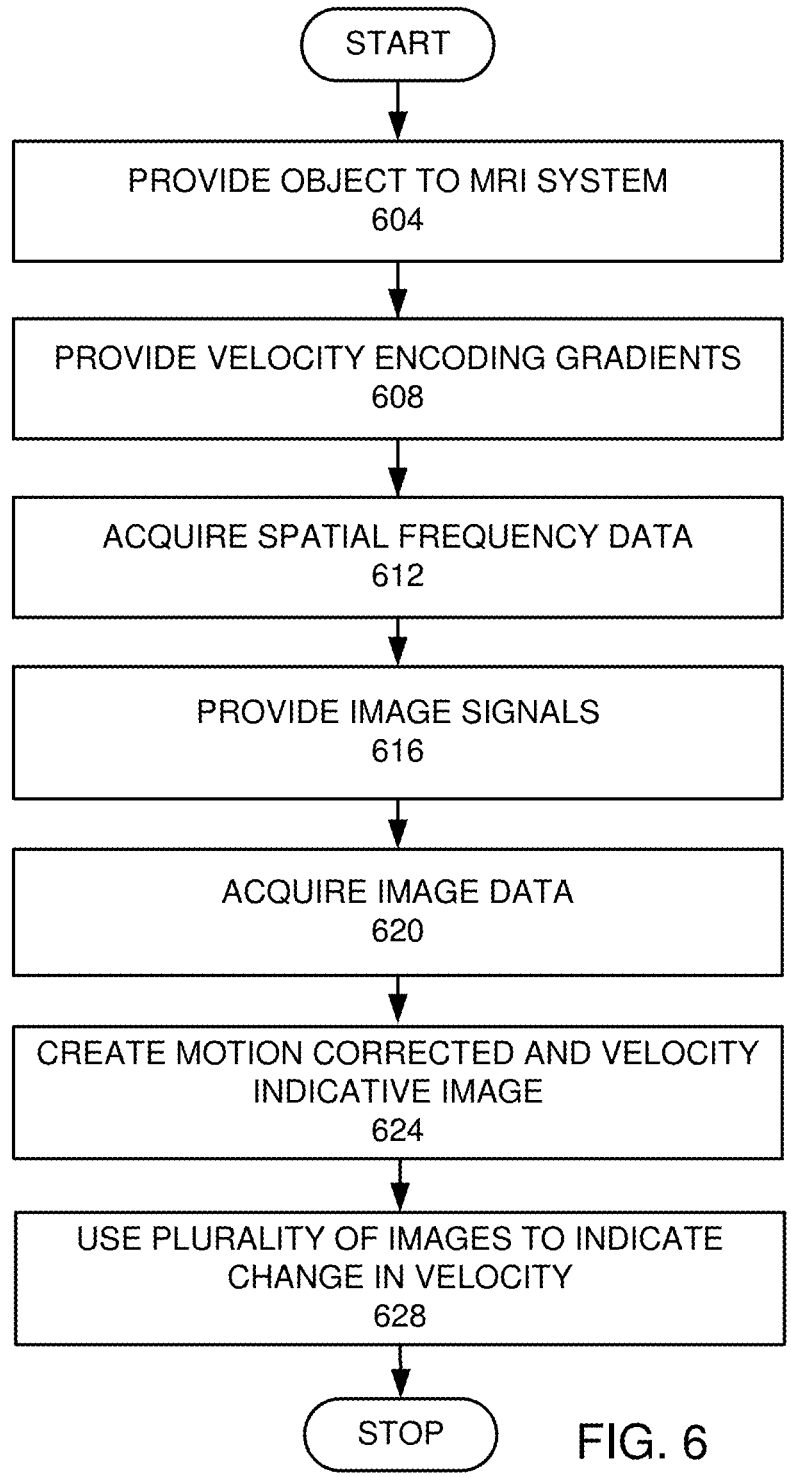
FIG. 6 is a flow chart of an embodiment of the invention.

To facilitate the understanding of the invention, FIG. 6 is a high level flow chart of an embodiment of the invention. An object is provided to a MRI system (step 604). Velocity encoded gradients are provided by the MRI system to the object (step 608). Spatial frequency data is acquired with velocity-encoded as a result of the velocity encoded gradients (step 612). Image signals are provided by the MRI system to the object (step 616). Image data is acquired as a result of the image signals (step 620). The image data and spatial frequency data are used to create a motion corrected and velocity indicative image (step 624). A plurality of motion corrected and velocity indicative images are used to show change of velocity over time (step 628).

Figure 7:
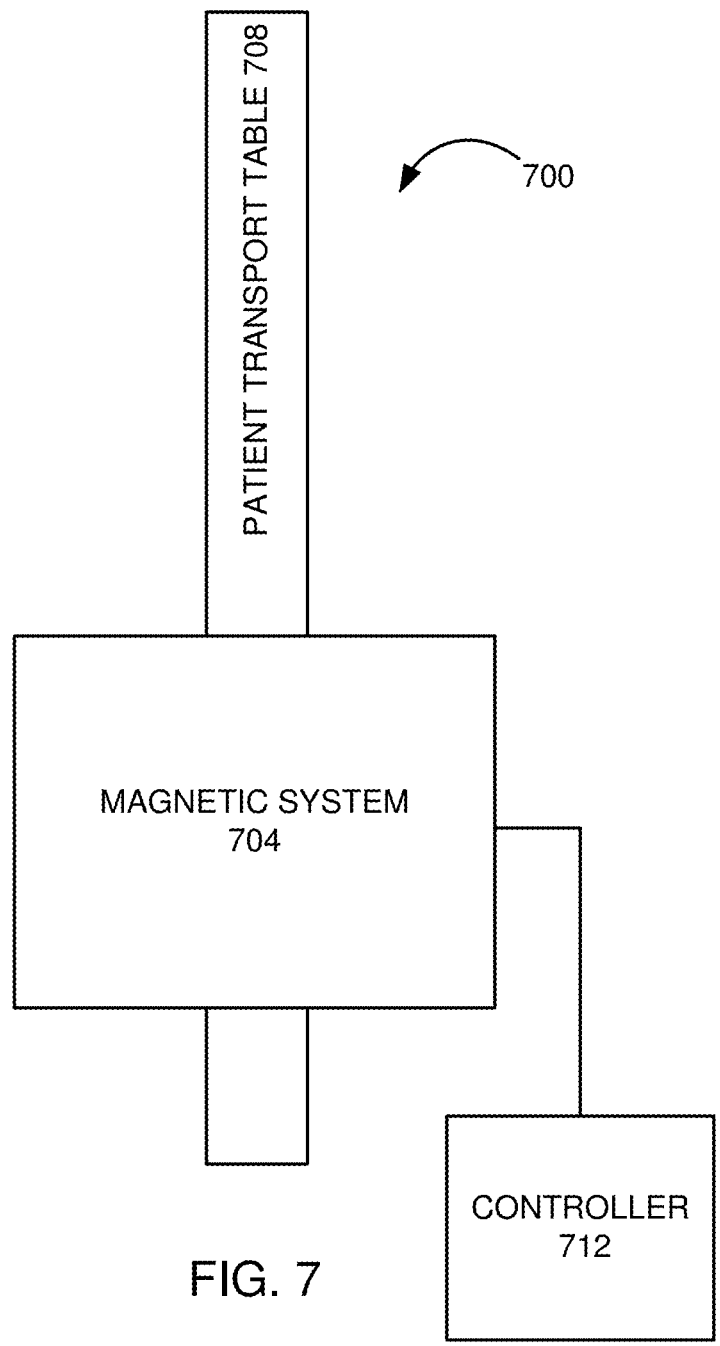
FIG. 7 is a schematic top view of a magnetic resonance imaging (MRI) system that may be used in an embodiment of the invention.

In a more specific example, an object is provided to an MRI system (step 604) FIG. 7 is a schematic top view of a magnetic resonance imaging (MRI) system 700 that may be used in an embodiment of the invention. The MRI system 700 comprises a magnet system 704, a patient transport table 708 connected to the magnet system, and a controller 712 controllably connected to the magnet system. In one example, a patient would lie on the patient transport table 708 and the magnet system 704 would pass around the patient. The controller 712 would control magnetic fields and radio frequency (RF) signals provided by the magnet system 704 and would receive signals from detectors in the magnet system 704.

Figure 8:
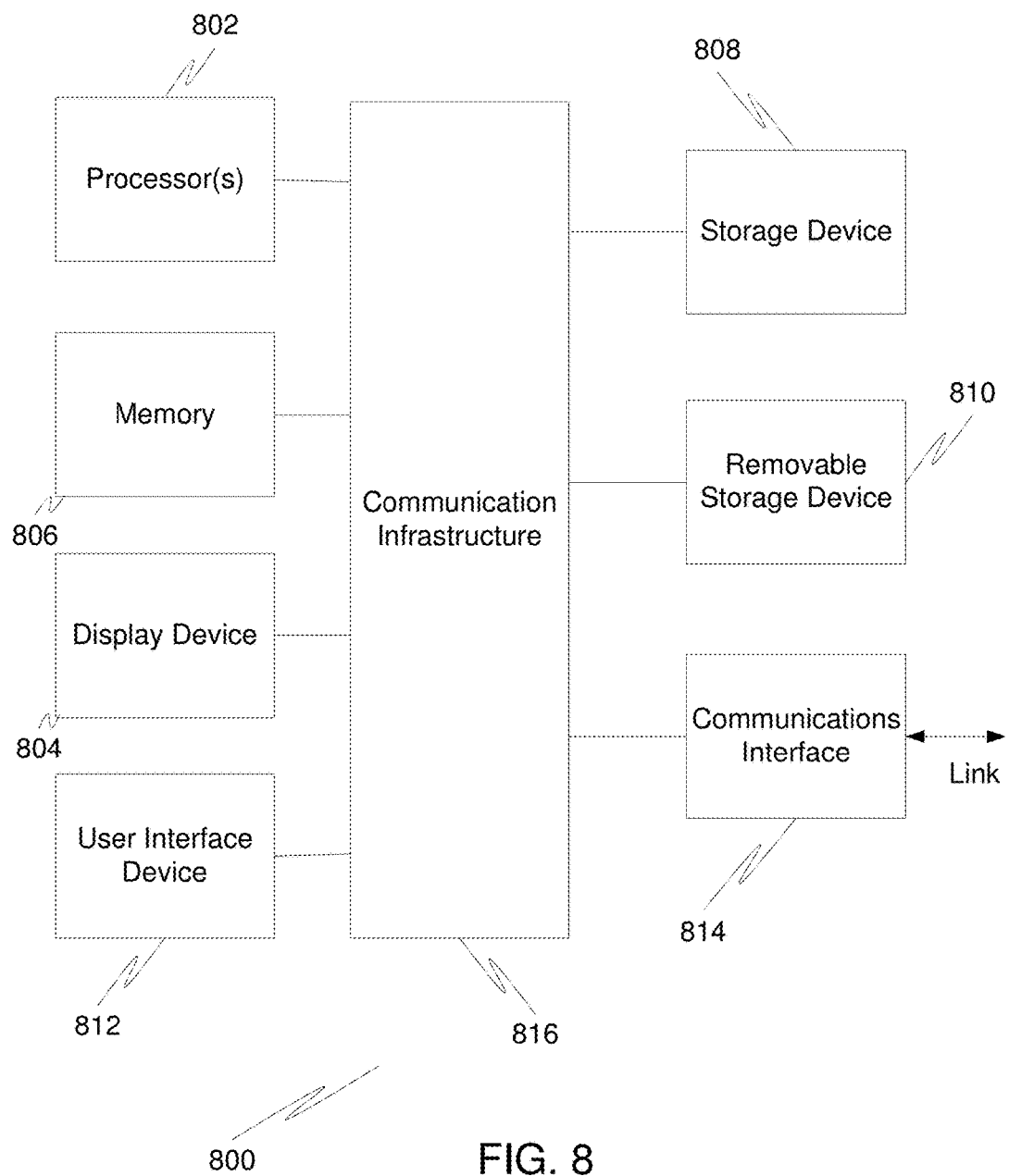
FIG. 8 illustrates a computer system that may be used in an embodiment of the invention.

FIG. 8 is a high level block diagram showing a computer system 800, which may be used to provide the controller 712. The computer system may have many physical forms ranging from an integrated circuit, a printed circuit board, and a small handheld device up to a computer. The computer system 800 includes one or more processors 802, and further can include an electronic display device 804, a main memory 806 (e.g., random access memory (RAM)), storage device 808 (e.g., hard disk drive), removable storage device 810 (e.g., optical disk drive), user interface devices 812 (e.g., keyboards, touch screens, keypads, mice or other pointing devices, etc.), and a communication interface 814 (e.g., wireless network interface). The communication interface 814 allows software and data to be transferred between the computer system 800 and external devices via a link. The system may also include a communications infrastructure 816 (e.g., a communications bus, cross-over bar, or network) to which the aforementioned devices/modules are connected.

Information transferred via communications interface 814 may be in the form of signals such as electronic, electromagnetic, optical, or other signals capable of being received by communications interface 814, via a communication link that carries signals and may be implemented using wire or cable, fiber optics, a phone line, a cellular phone link, a radio frequency link, and/or other communication channels. With such a communications interface, it is contemplated that the one or more processors 802 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this embodiment, the object is the patient who is placed on the patient transport table 708. Velocity encoded gradients are provided by the MRI system to the object (step 608). In FIG. 1, region 104 indicates the time period where velocity encoded gradients are provided in the x, y, and z directions of k-space. Similar gradients are described in U.S. Pat. No. 7,692,423, entitled SELF NAVIGATING CARTESIAN TRAJECTORY, to Cunningham et al., and issued on Apr. 6, 2010, which is incorporated by reference for all purposes. As shown in FIG. 1, region 104, the signal for $G_x$ provides a gradient and a mirror reflection, as indicated by a lighter shade. This is also shown for the signal for $G_y$ and the signal for G. The process of U.S. Pat. No. 7,692,423 uses pre-winders and rewinders. Such pre-winders and rewinders may be used in embodiments of the invention.

Spatial frequency data is acquired through the MRI system resulting from the encoding gradients (step 612). U.S. Pat. No. 7,692,423 explains how such gradients are used for navigation and motion detection. This embodiment may use the same sequence timing and gradient waveforms as described in U.S. Pat. No. 7,692,423, but provides an additional acquisition to collect navigator data during the velocity encoding gradients. In this embodiment, such gradients will also be used for velocity measurement. If there is no movement in the x direction of k-space, then the acquired data from the $G_x$ signals will not have a phase difference. If there is movement, then the acquired data from the $G_x$ signals will have a phase difference dependent on the velocity of movement. Since the acquired data is used to determine navigation, motion, and other sources of signal fluctuations, the spatial frequency data acquired in this embodiment is lower resolution than the resolution of the acquired image data. These velocity-encoding gradients can be combined with or be separate from the pre-winder gradients used for acquiring the image data.

The MRI system provides image signals to the object (step 616). Such image signals are provided in region 108 of FIG. 1. The MRI system acquires image data (or readout) resulting from the image signals (step 620). Since such data is used to provide an image, the acquired image data is of higher resolution than the spatial frequency data. From the velocity-encoding gradients, the acquired image data will have velocity information in its phase in the image domain.

Figure 9:
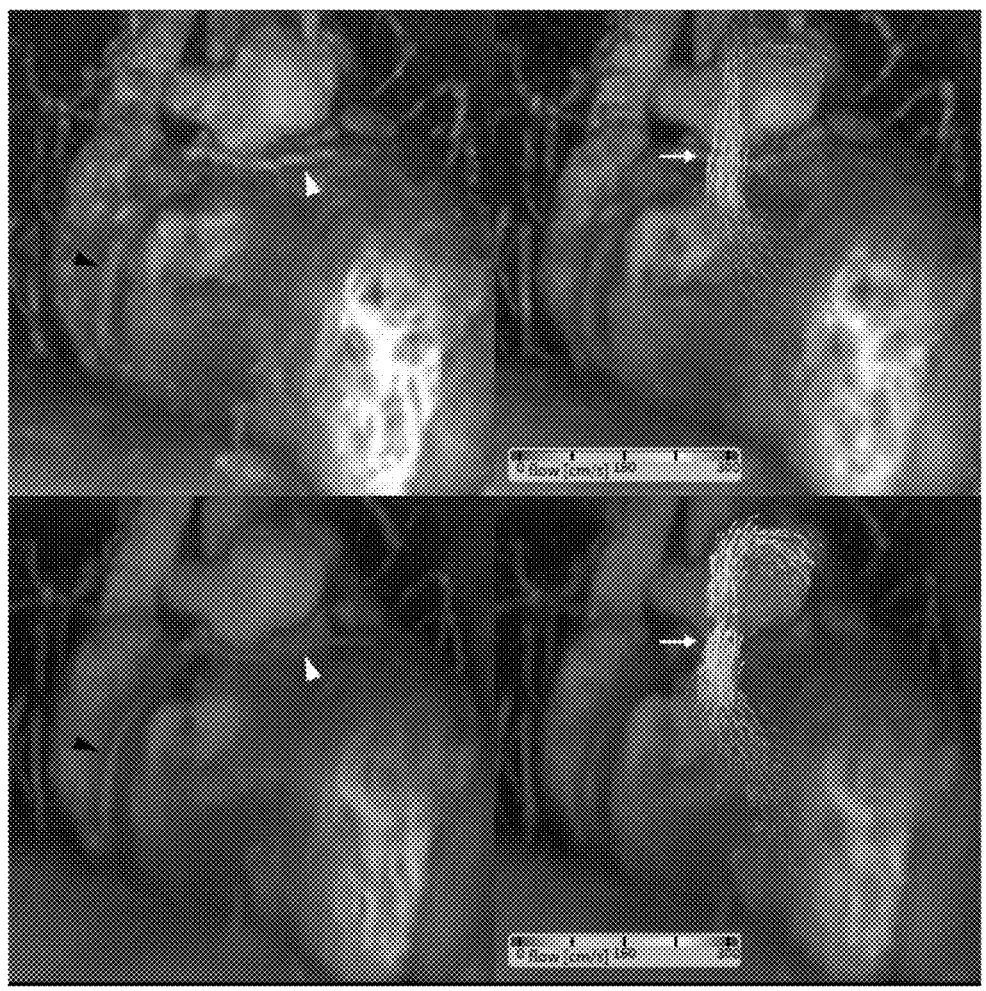
FIG. 9 shows a cardiac-phase-resolved volumetric phase-contrast scan of a 7.1-year-old male with aortic arch hypoplasia.

At least one motion corrected and velocity indicative magnetic resonance image is created from the acquired spatial frequency data and image data (step 624). FIG. 9 shows a cardiac-phase-resolved volumetric phase-contrast scan of a 7.1-year-old male with aortic arch hypoplasia. Results without motion compensation are shown in the top row. Results with motion compensation are shown in the bottom row. In the left column, surface renderings of the most motion-quiescent cardiac phase depict the coronary arteries (triangles) with an anomalous coronary wrapping around the pulmonary artery (white triangle). In the right column, the systolic phases are surface rendered with overlaid shaded velocity vectors. The flow can be seen going through the pulmonary artery (white arrow). With reduced artifacts from motion, the renderings with motion compensation (bottom) more clearly delineate the coronary arteries and the recirculating flow in the left pulmonary artery. The bottom left image of FIG. 9 provides motion correction, which removes artifacts and blurring caused by motion of the heart, and further indicates velocity of the blood, where direction is indicated by the direction of the shaded arrows and magnitude is indicated by the shading.

Figure 10:
FIG. 10 is an image of a heart during a diastole phase.
Figure 11:
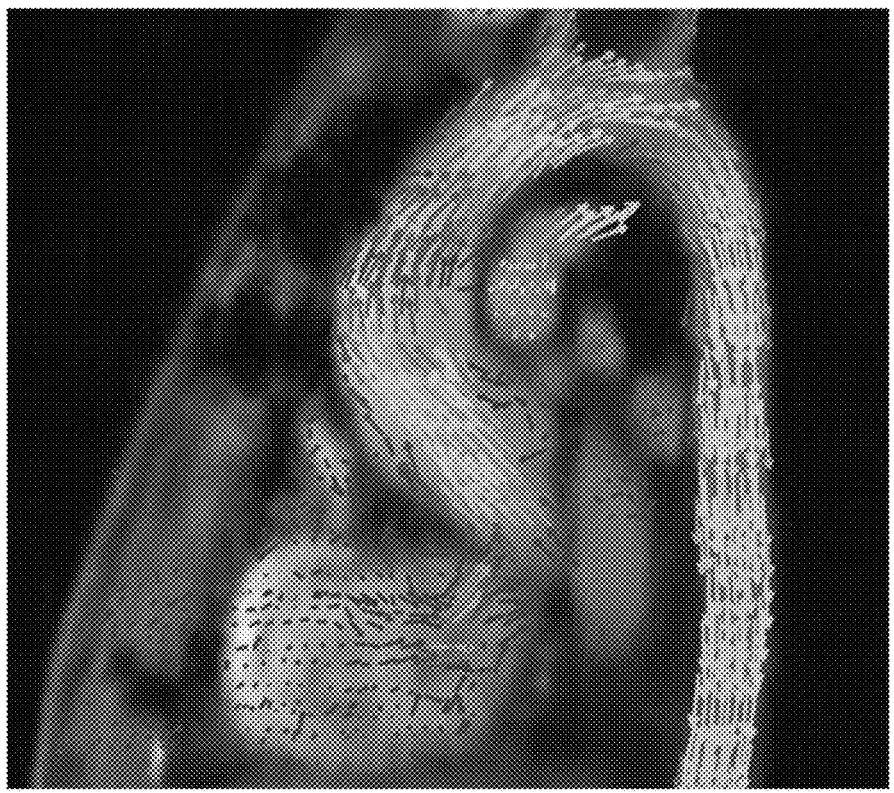
FIG. 11 is an image of a heart during a systole phase.

A plurality of images may be provided to indicate change in velocity (step 628). FIG. 10 is an image of a heart during a diastole phase. Vectors highlighting the aortic arch show the direction and velocity of blood flowing through the aortic arch. The direction of the vectors indicates the direction of the blood flow. The shading of the vectors indicates the speed of the blood flow. FIG. 11 is an image of a heart during a systole phase. It can be seen that the velocity of the blood flow increases in the aortic arch during the systole phase, and is minimal during the diastole phase. The ability to see the change in velocity within the body provides an additional noninvasive diagnostic tool.

Various embodiments provide improved patient motion monitoring and image correction. Various embodiments provide soft-gating by weighting data based on degree of motion corruption. In addition, cardiac and/or respiratory motion resolution, linear motion correction and/or nonrigid motion correction may also be provided. Various embodiments can be used in conjunction with any type of MR sampling trajectory and image reconstruction strategy for any type of application. Such applications may include abdominal imaging, cardiac imaging, and even head scans. Various embodiments may be useful for cases when patients have difficulty holding still for long periods, so that this imaging modality can be made accessible to a wider patient population. Because various embodiments provide intrinsic navigators to be collected, the motion estimated is automatically aligned with the acquired imaging data.

In various embodiments the order of the velocity-encoding gradients is arbitrary as long as these velocity-encoding gradients are repeated throughout the scan. Any sampling strategy—both Cartesian and non-Cartesian—can be used in conjunction with this invention. As long as velocity-encoding gradients are required, this flow navigator is readily available. The flow navigators can be used to monitor changes during the sequence such as varying field variations. The motion estimation can be used for motion gating, motion detection, and motion correction. With the use of a high-density multi-channel coil receiver, nonrigid motion can be described. Various embodiments provide 2-dimensional or 3-dimensional imaging techniques. Various embodiments can be used in conjunction with any subsampling strategies including partial k-space imaging, parallel imaging, and compressed sensing. With enough different velocity-encoding gradient configurations, a low-resolution navigator image can be constructed as an image-based navigator. The flow navigators can provide enough motion information to resolve respiratory and/or cardiac motion. The flow navigator can also be collected for the motion-sensitizing gradients in Magnetic Resonance Elastography. The navigator can also be collected for diffusion-weighting gradients both for the spin-echo sequence and for the gradient-echo sequence.

Various embodiments provide an intrinsic approach to monitoring k-space fluctuations throughout the scan sequence. This navigator information is readily available in phase-contrast MRI where different velocity-encoding gradients are repeated throughout the sequence. No alterations to the sequence timing and gradient waveforms are required; the only requirement is being able to extend the acquisition window to include these gradients. This can be directly used for motion compensation purposes. The image or images may be displayed on a display.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for an object in a magnetic resonance image (MRI) system for providing at least one velocity indicative magnetic resonance image (MRI) with motion correction of the object, comprising:
   providing from the MRI system velocity encoding gradients in at least one spatial direction, wherein part of the velocity encoding gradients is a navigator signal;
   acquiring through the MRI system spatial frequency data with encoded velocity information resulting from the velocity encoding gradients;
   providing from the MRI system image signals;
   acquiring through the MRI system image data resulting from the image signals; and
   creating at least one motion corrected and velocity indicative magnetic resonance image from the acquired spatial frequency data and image data.

2. The method, as recited in claim 1, wherein the MRI system comprises a plurality of channels, and wherein a different spatially-localized navigator signal is provided for each channel.

3. The method, as recited in claim 2, wherein the creating the from the MRI system at least one motion corrected and velocity indicative MRI, comprises:
   determining displacement;
   using the determined displacement for motion correction.

4. The method, as recited in claim 3, wherein the providing from the MRI system velocity encoding gradients in at least one spatial direction is provided for each sequence repetition before each providing MRI system image signals.

5. The method, as recited in claim 4, wherein the acquiring the spatial frequency data is at a lower resolution than the acquiring image data.

6. The method, as recited in claim 5, wherein the creating at least one motion corrected and velocity indicative magnetic resonance image indicates velocity using at least one of a vector, color, or shading.

7. The method, as recited in claim 6, wherein direction of velocity is indicated by a vector direction.

8. The method, as recited in claim 7, wherein the magnitude of velocity is indicated by color, shading, or length of the vector.

9. The method, as recited in claim 8, wherein the creating at least one motion corrected and velocity indicative magnetic resonance image from the acquired spatial frequency data and image data creates a plurality of motion corrected and velocity indicative magnetic resonance images, further comprising using the plurality of motion corrected and velocity indicative magnetic resonance images to indicate change in velocity.

10. The method, as recited in claim 9, wherein the motion corrected and velocity indicative MRI includes an image of a blood vessel, wherein a location of the blood vessel is motion corrected and the velocity indicative MRI indicates direction and magnitude of the velocity of blood flow in the blood vessel.

11. The method, as recited in claim 1, wherein the providing from the MRI system velocity encoding gradients in at least one spatial direction is provided for each sequence repetition before each providing MRI system image signals.

12. The method, as recited in claim 1, wherein the acquiring the spatial frequency data is at a lower resolution than the acquiring image data.

13. The method, as recited in claim 1, wherein the creating at least one motion corrected and velocity indicative magnetic resonance image indicates velocity using at least one of a vector, color, or shading.

14. The method, as recited in claim 13, wherein direction of velocity is indicated by a vector direction.

15. The method, as recited in claim 1, wherein the creating at least one motion corrected and velocity indicative magnetic resonance image from the acquired spatial frequency data and image data creates a plurality of motion corrected and velocity indicative magnetic resonance images, further comprising using the plurality of motion corrected and velocity indicative magnetic resonance images to indicate change in velocity.

16. The method, as recited in claim 1, wherein the motion corrected and velocity indicative MRI includes an image of a blood vessel, wherein a location of the blood vessel is motion corrected and the velocity indicative MRI indicates direction and magnitude of the velocity of blood flow in the blood vessel.

17. A method for an object in a multiple channel magnetic resonance image (MRI) system for providing a plurality of velocity indicative magnetic resonance images (MRI) with motion correction of the object, comprising:
   providing a cycle, wherein each cycle comprises:
      providing from the MRI system velocity encoding gradients in at least one spatial direction, wherein part of the velocity encoding gradients is a navigator signal;
      acquiring through the MRI system spatial frequency data with encoded velocity information resulting from the velocity encoding gradients;
      providing from the MRI system image signals; and
      acquiring through the MRI system image data resulting from the image signals, wherein the acquiring the spatial frequency data is at a lower resolution than the acquiring image data; and
   after a plurality of cycles, creating an at least one motion corrected and velocity indicative magnetic resonance image from the acquired spatial frequency data and image data.

18. An apparatus for providing velocity indicative and motion corrected magnetic resonance images (MRI), comprising:
   a magnetic resonance imaging excitation and detection system with a plurality of channels; and
   a controller electrically connected to the magnetic resonance imaging excitation and detection system, comprising:
      a display;
      at least one processor; and
      non-transitory computer readable media, comprising:
         computer readable code for providing velocity encoding gradients in at least one spatial direction from the magnetic resonance imaging excitation and detection system, wherein part of the velocity encoding gradients is a navigator signal;
         computer readable code for acquiring, through the plurality of channels, spatial frequency data with encoded velocity information resulting from the velocity encoding gradients;
         computer readable code for providing image signals from the magnetic resonance imaging excitation and detection system;

computer readable code for acquiring image data resulting from the image signals, through the plurality of channels;

computer readable code for creating at least one motion corrected and velocity indicative magnetic resonance image from the acquired spatial frequency data and image data; and computer readable code for displaying the at least one motion corrected and velocity indicative magnetic resonance image on the display.

* * * * *